United States Patent [19]
Miyamoto et al.

[11] Patent Number: 5,359,221
[45] Date of Patent: Oct. 25, 1994

[54] SEMICONDUCTOR DEVICE

[75] Inventors: Masafumi Miyamoto, Koganei; Ryo Nagai, Mizuho; Tatsuya Ishii, Hachioji; Koichi Seki, Hino, all of Japan

[73] Assignee: Hitachi, Ltd., Tokyo, Japan

[21] Appl. No.: 86,096

[22] Filed: Jul. 6, 1993

[30] Foreign Application Priority Data

Jul. 10, 1992 [JP] Japan .................. 4-183448

[51] Int. Cl.$^5$ .................. H01L 29/10; H01L 29/78
[52] U.S. Cl. .................. 257/408; 257/327; 257/330; 257/335; 257/345
[58] Field of Search .................. 257/327, 335, 345, 330, 257/332, 336-340, 344, 408

[56] References Cited
FOREIGN PATENT DOCUMENTS

| | | | |
|---|---|---|---|
| 0274278 | 7/1988 | European Pat. Off. | ............ 257/345 |
| 2703877 | 8/1978 | Fed. Rep. of Germany | ...... 257/345 |
| 63-300567 | 12/1988 | Japan | .................. 257/345 |
| 1-280358 | 11/1989 | Japan | .................. 257/345 |
| 2-31464 | 2/1990 | Japan | .................. 257/345 |

*Primary Examiner*—J. Carroll
*Attorney, Agent, or Firm*—Antonelli, Terry, Stout & Kraus

[57] ABSTRACT

Source and drain regions are formed in first regions of low concentration formed on a surface of a semiconductor surface, and a second region with doping concentration higher than that of the first regions is formed around the first regions. Further in the second region, third regions with doping concentration higher than that of the second region are formed separate from each other. By virtue of this, a rise of the threshold voltage attendant on a decrease of the channel length is canceled out by the third regions and the short channel effect is suppressed. Further, since doping concentration of the first region is low, high carrier mobility can be obtained.

25 Claims, 14 Drawing Sheets

SEMICONDUCTOR DEVICE

BACKGROUND OF THE INVENTION

The present invention relates to semiconductor devices, and more specifically to a MIS semiconductor device which can suppress threshold voltage variation caused by channel length variation and which is suited to low voltage operation.

In a MIS semiconductor device represented by a MOS transistor, as integration density is increased and small size fabrication technology is developed, gate length becomes short and specific problems called "short channel effect" are produced. One of such problems is that threshold voltage is lowered as channel length becomes short. Lowering of the threshold voltage attendant on the shortening of the channel length becomes large as the channel length becomes shorter, and also fluctuation of the threshold voltage of the transistor becomes large due to fluctuation of the dimension of the gate electrode produced during forming the gate electrode. In low voltage operation of a transistor, since threshold voltage significantly affects the circuit characteristics, the fluctuation of the threshold voltage becomes a serious problem to disturb the low voltage operation.

The short channel effect occurs because a depletion layer spreads within the channel region due to the electric field of drain and the source, and ratio of the channel region capable of being controlled by the gate electric field is decreased. If this phenomenon becomes large, the depletion layers of drain and source touch with each other, and a problem called punch through occurs where current flows even if the gate voltage is not applied.

In order to reduce these problems, a simple scaling law method has been used in which the substrate dopant concentration is raised and spread of the depletion layer from the source and drain is suppressed.

In this method, however, since the threshold voltage rises as the substrate dopant concentration rises, in order to hold the threshold voltage to a conventional value, the thickness of the gate insulation film must be thinned simultaneously.

If the thickness of the gate insulation film is thinned too much, the insulator break down voltage is lowered. Therefore, and therefore in a transistor in the submicron region, a point is reached where the gate insulation film cannot be thinned so much and the above-noted simple scaling law cannot be applied. Also, as the substrate dopant concentration of the channel region rises, a problem is produced that carrier mobility is lowered by scattering of carrier due to an increase in dopants.

Conventional example 1 to reduce fluctuation of the threshold voltage in a conventional MIS semiconductor device caused by the short channel effect is disclosed in Y. Okamura, et al, "A Novel Source-to-Drain Nonuniformly Doped Channel (NUDC) MOSFET for High Current Drivability and Threshold voltage Controllability" IEDM Tech. Digest, pp. 391-394, 1990.

The structure of the conventional example 1 is shown in FIG. 5. Doping concentration of a substrate surface region 12 in the channel edge is made higher than that of a substrate surface 1 at the channel center, and the substrate doping profile at the channel center a—a' and the channel edge b—b' becomes as shown in FIG. 7. In this structure, since the threshold voltage of the region 12 in a definite distance from both ends of the channel becomes higher than that of the center 1, the effective threshold voltage determined by an average of the whole channel region becomes high as the channel length becomes short. This property and the lowering of the threshold voltage due to the short channel effect are canceled out, thereby the threshold voltage can be held nearly constant even if the channel length becomes short. Also in this structure, since concentration of the region 12 bordering on the source and drain and regions 4 is high and the depletion layer width can be suppressed, it is also effective for the punch through.

The method of forming a high concentration region 12 of a MOS semiconductor device in the conventional example in FIG. 5 is shown in FIG. 11. The high concentration region 12 is formed in self alignment after a gate electrode 3 is formed, using the gate electrode 3 as a mask, wherein p-type impurity having the same doping type as that of a substrate 1 is subjected to oblique ion implantation. Ions implanted from the side surface of the gate electrode 3 attain to the surface of the substrate 1 and the surface concentration of a part in a definite distance from the channel edge becomes high.

Next, in simple scaling law, due to the substrate dopant concentration increasing in inverse proportion to dimension of the gate electrode, the impurity scattering is increased and the mobility is lowered. Conventional example 2 to deal with this problem is disclosed in JPA No. 32462/1986 or M. Aoki, et al., "0.1 $\mu$m CMOS Devices Using Low-Impurity--channel Transistors (LICT)" IEDM Tech. Digest. pp. 939-941, 1990. Structure of the conventional example 2 is shown in FIG. 6. Impurity concentration of a surface region 5 of a substrate with a MOS inversion layer formed thereon is made low and scattering of carrier due to impurity is suppressed and high mobility is obtained, and a region 1 of high concentration is provided under the surface region 5 so as to suppress the punch through.

In the conventional example 1, lowering of the threshold voltage in the case of the channel length being short can be suppressed, but the mobility is lowered since high concentration region is provided on the substrate surface of the channel region. Particularly, when the channel length is short, almost the whole channel region becomes high concentration and it has no difference from a device with the substrate dopant concentration raised by conventional simple scaling, thereby the mobility is lowered significantly. If the mobility is lowered, drain current is decreased resulting in lowering of the circuit operation speed. Since the region of high concentration is formed by conventional oblique ion implantation, ions are implanted also to the surface of the substrate of the channel region and therefore the mobility is lowered too.

Also in the conventional example 2, although rise of the mobility of the carrier and suppression of the punch through are noticed, lowering of the threshold voltage due to the short channel effect is not considered well.

SUMMARY OF THE INVENTION

An object of the present invention is to provide a MIS semiconductor device where lowering of the threshold voltage due to the short channel effect is suppressed, and fluctuation of the threshold voltage caused by fluctuation of dimension of the gate electrode is reduced and the carrier mobility is high.

Another object of the present invention is to provide a semiconductor integrated circuit suitable for the low voltage operation.

The foregoing objects can be attained as shown in FIG. 1 in that a surface region 5 of a semiconductor substrate with a channel region formed thereon is made low doping concentration and high doping concentration regions 6, 7 are provided under it, and that among the high concentration regions 6, 7, impurity of the region 7 formed to the outside from the point in the definite distance Lp from the channel edge is made higher than that of the region 6 formed under the channel center.

Since the depth Xp from the semiconductor surface of the high concentration region 7 must be set to depth capable of controlling the threshold voltage, it is made depth within the region where potential of the band is deteriorated when the MOS inversion layer is formed. The distance Lp is made less than ½ of the channel length so that the high concentration region 7 at the source side and the drain side do not contact with each other even at the minimum channel length.

Also as shown in FIG. 2, among the high concentration regions 6, 7 within the substrate, the region 7 in the definite distance Lp from the channel edge is made shallower than the high concentration region 6 at the channel center thereby equivalent effect can be obtained.

Further as shown in FIG. 3a, almost the whole channel region is made the graded substrate doping profile where the doping concentration is raised from the semiconductor surface towards the inside of the substrate, and gradient of the substrate doping profile of a part in a definite distance on both sides or one side of the channel edge may be made larger than that of the channel center.

The doping profile as shown in FIG. 3b is obtained in that a high concentration buried layer 6 is formed by deep ion implantation before forming a gate electrode 3 as shown in FIG. 12a to FIG. 12d, and after forming the gate electrode 3, a side wall 26 of material with the projection range of the ion implantation being shorter than the gate electrode is formed on the side surface of the gate electrode 3 and oblique ion implantation is carried out as shown in FIG. 12c, and the ion implantation from the side surface of the gate electrode is protected and a high concentration buried layer 7 is formed.

Factors to determine the threshold voltage of the MIS transistor include difference in work function between material to constitute the gate electrode and the semiconductor, thickness of the insulation film and the doping concentration of the semiconductor substrate. Explaining the doping concentration of the semiconductor substrate more strictly, when the MIS inversion layer is formed, the threshold voltage is determined by the doping concentration included in the region with the potential of the band varying. In the present invention, as shown in FIG. 1, the channel region is formed by the two layers, the surface region 5 of the semiconductor substrate and the high concentration regions 6, 7 formed within the substrate, and if the depth Xp of the high concentration regions 6, 7 is shallower than depth of the potential of the band varying when the inversion layer is formed, the threshold voltage is determined by the doping concentration of these regions 6, 7. Consequently, in the structure of the present invention, if the high concentration region 7 at the channel edge is made high concentration in comparison with the high concentration region 6 at the channel center, the threshold voltage at the channel edge can be made higher than that of the channel center.

Also as shown in FIG. 2, when depth of the high concentration region 7 formed below the channel edge is made shallower than that of the high concentration region 6 at the channel center and the doping concentration is made higher than that of the high concentration region 6 at the center, since ratio of the high concentration region within the depth of the band potential varying during forming the inversion layer is increased, the threshold voltage at the channel edge can be made high.

Further as shown in FIG. 3, when the doping concentration of the channel region varies depending on depth from the surface of the semiconductor substrate and the depth becomes large, the threshold voltage is determined by the surface concentration and the gradient. Assuming that the doping profile increases in exponential as it approaches the inside of the substrate, variation of the threshold voltage depending on exponential coefficient (gradient) $\alpha$ in the case of the surface concentration being $10^{17}/cm^2$ and the oxide film thickness being 6 nm is shown in FIG. 4. As seen from FIG. 4, even if the substrate surface concentration is the same, when the gradient of the doping profile at the channel edge is made large, the threshold voltage at the channel edge can be made higher than that of the channel center.

In the structure as above described, since the distance Lp of the high concentration region 7 extending to the channel region is constant irrespective of the channel length, as the channel length becomes short, ratio of the channel region having the high threshold voltage becomes large thereby the effective threshold voltage of the whole MIS transistor can be made higher gradually. If the design is carried out so that this effect and the lowering of the threshold voltage due to the short channel effect cancel out, the threshold voltage becomes substantially constant irrespective of the channel length, and even if dimension of the gate fluctuates, the threshold voltage can be made substantially constant. Also since the semiconductor surface region 5 of the channel region becomes low concentration throughout the whole channel, the carrier scattering due to the impurity is little and the carrier mobility can be made high.

In the present invention, it is not preferable that the two high concentration regions 7 arranged opposite touch each other at the channel center and the region 6 of low threshold voltage disappears and the whole channel region becomes only a region of the high threshold voltage. Since structure in a region having shorter channel than the channel length of the two high concentration regions 7 contacting becomes similar structure to the conventional example 2, the threshold voltage is lowered as the channel length becomes short. Consequently, the entering distance Lp to the channel region must be made less than ½ of the design minimum channel length.

In the semiconductor device of the present invention, as shown in FIG. 12a–12d, ion implantation is carried out before forming the gate electrode and the high concentration region 6 is formed in the whole channel region, and after forming the gate electrode 3, ion implantation is carried out using the gate electrode 3 as a mask thereby the high concentration region 7 is formed.

According to this method, the high concentration region 7 can be formed in self align from the edge of the gate electrode 3 in definite penetrating depth irrespective of the gate length. In order that the surface of the channel edge does not become high concentration, after forming the gate electrode 3, the side wall made of material having the projection range of the ion implantation shorter than the gate electrode 3 is formed on the side surface of the gate electrode 3, and then the oblique ion implantation is carried out and the high concentration region 7 is formed. The ion implantation from the side surface of the gate electrode 3 is prevented by the side wall 26 provided on the side surface of the gate electrode 3 and the channel surface is held to low concentration, and at the same time, the high concentration region 7 is formed overlapping the high concentration region 6 within the substrate and the threshold voltage at the channel edge can be made high.

DETAILED DESCRIPTION OF THE PREFERRED EMBODIMENTS

Embodiments of the present invention will be described using the accompanying drawings. In the following embodiments, an n-type MOS transistor as an example is mainly described, but the invention can be embodied similarly for a p-type MOS transistor. Also material other than an insulation film of oxidized silicon may be used.

EXAMPLE 1

Figure 1:
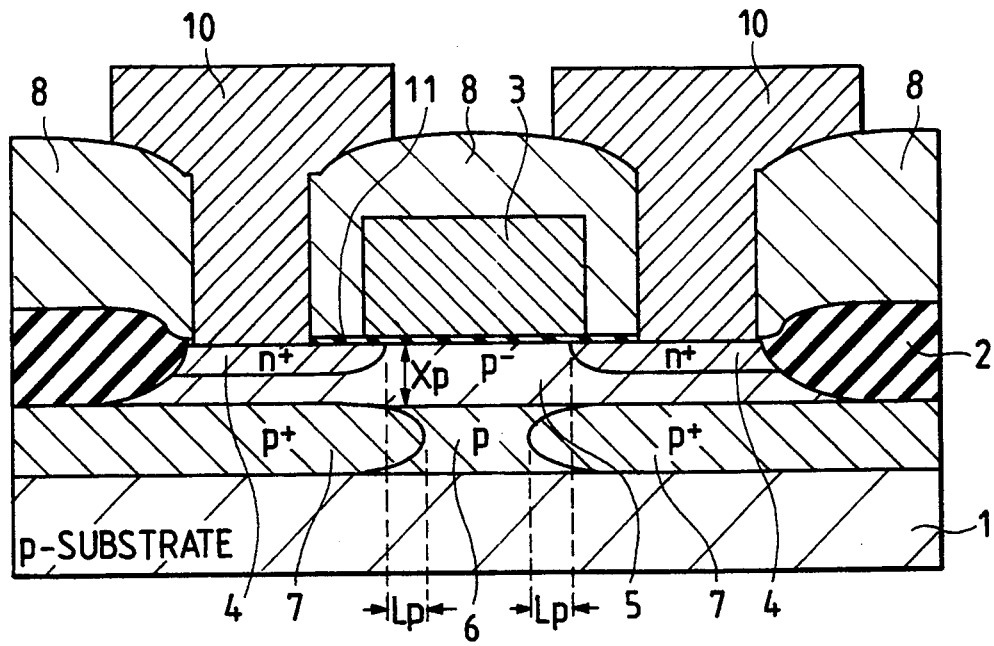
FIG. 1 is a sectional view showing the embodiment 1 of the invention.

As shown in FIG. 1, a MOS transistor is formed within a region enclosed by an isolation oxide film 2 formed on a surface of a semiconductor substrate 1. Doping concentration of the p-type semiconductor substrate 1 is $1 \times 10^{16}/cm^3$, and a p-type high concentration region 6 at the channel center is formed by ion implantation of boron in 120 keV before forming a gate electrode 3 and has doping concentration of $1 \times 10^{18}/cm^3$. Depth Xp of the high density region 6 is about 0.05 μm. After forming a gate oxide film 11, polysilicon is deposited and phosphorus is doped, and then an unnecessary part is removed by known dry etching and the gate electrode 3 is formed. Next, using the gate as a mask, boron is subjected to ion implantation in acceleration voltage of 120 keV, and a p-type high concentration region 7 with doping concentration being $4 \times 10^{18}/cm^3$ is formed in the channel edge. When the high concentration regions 6, 7 are formed by ion implantation, since the high concentration layer is formed on the whole semiconductor surface including a part under the isolation oxide film 2, the forming process of a channel stopper in the isolation region may be omitted in the case of using the transistor at low supply voltage. Next, after the ion implantation to form the source and drain regions 4, annealing is carried out in 850° C. for 10 minutes and the implanted impurity is diffused. Then also the high concentration region 7 is diffused in the channel region and enters the channel region by the distance Lp (about 0.05 μm) from the channel edge.

A low concentration layer 5 may be formed by ion implantation of impurity of opposite conductive type to the inside of the substrate onto the surface of the substrate 1. If the surface low concentration layer 5 is formed by epitaxial growth of silicon not including the conductive impurity, the surface can be made further low concentration and the impurity scattering can be reduced significantly, whereby the carrier mobility can be further raised. Also, if silicon germanium or the like with the mobility higher than that of silicon is used, the surface low concentration layer 5 can be moved further at higher mobility.

According to this embodiment, by the high concentration region 7 entering by the definite distance Lp from the channel edge, since the effective threshold voltage rises as the channel length becomes short, in canceling-out of lowering of the threshold voltage due to the short channel effect, threshold voltage characteristics which are nearly constant with respect to the channel length are obtained.

Figure 8:
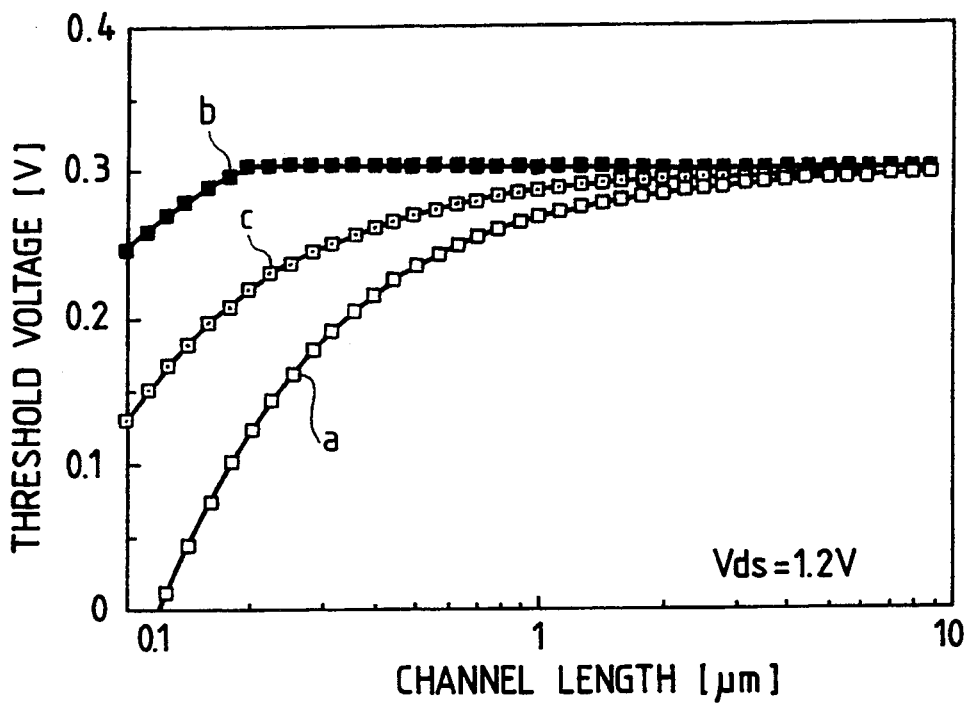
FIGS. 8 and 9 are graphs showing effect of the embodiment 1 of the invention.

The effect of this embodiment in dependence of the threshold voltage on the channel length is shown in FIG. 8. As shown in FIG. 8, in the MOSFET having usual structure, the threshold voltage rapidly decreases during the short channel as shown in curve a, whereas in the present invention and the conventional example 1, decrease of the threshold voltage is as small as 0.1 V or less even at quite small channel length of 0.1 μm as shown in curve b. Also there is effect to suppress the punch through by the high concentration layers 6, 7 buried in the inside of the substrate. In the prior art 2, since spread of the depletion layer of source, drain is suppressed by the high concentration layer within the substrate, as shown in curve c, improvement is seen in comparison with the MOSFET having conventional structure but its effect is not sufficient. As secondary effect of the high concentration buried layer 2, since the electric field becomes strong within the semiconductor substrate and the hot carrier is generated separate from the gate oxide film, deterioration of the gate oxide film can be reduced.

Figure 9:
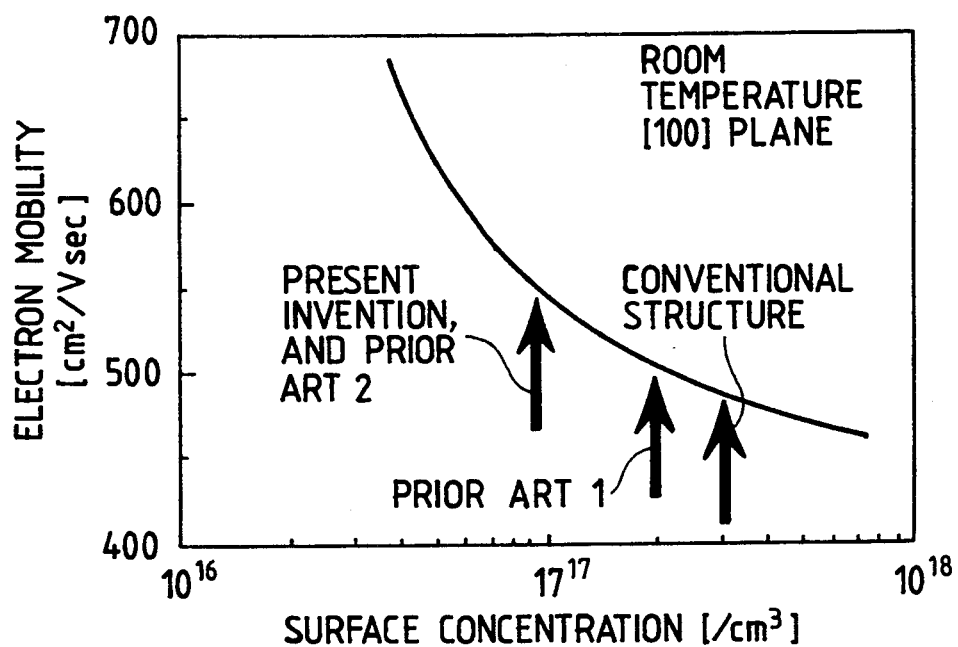

Next, effect of this embodiment in the carrier mobility of the MOS inversion layer is shown in FIG. 9. In this embodiment, since the semiconductor surface 5 with the MOS inversion layer formed thereon is at low concentration, the impurity scattering is little, and since the surface electric field in the interface with the insulation film 11 is reduced, the mobility can be raised. As shown in FIG. 9, in this embodiment and the prior art 2, the mobility can be raised about 20 percent in comparison with conventional structure by the low concentration layer 5 on the surface. On the other hand, in the prior art 1, since the high concentration region 12 exists on the semiconductor surface, the mobility is not different much from that of the MOSFET having conventional structure (at channel length 0.3 μm). At low temperature such as liquid nitrogen temperature, since phonon scattering due to the heat energy is decreased, ratio of the mobility determined by the impurity scattering is large and the mobility in this embodiment becomes about two times in comparison with conventional structure. Consequently, in this embodiment, lowering of the threshold voltage in the short channel is suppressed and fluctuation of the threshold voltage due to fluctuation of dimension of the gate electrode can be reduced significantly, and at the same time, the mobility can be increased about 20 percent at the room temperature and about two times at the liquid nitrogen temperature.

Figure 10:
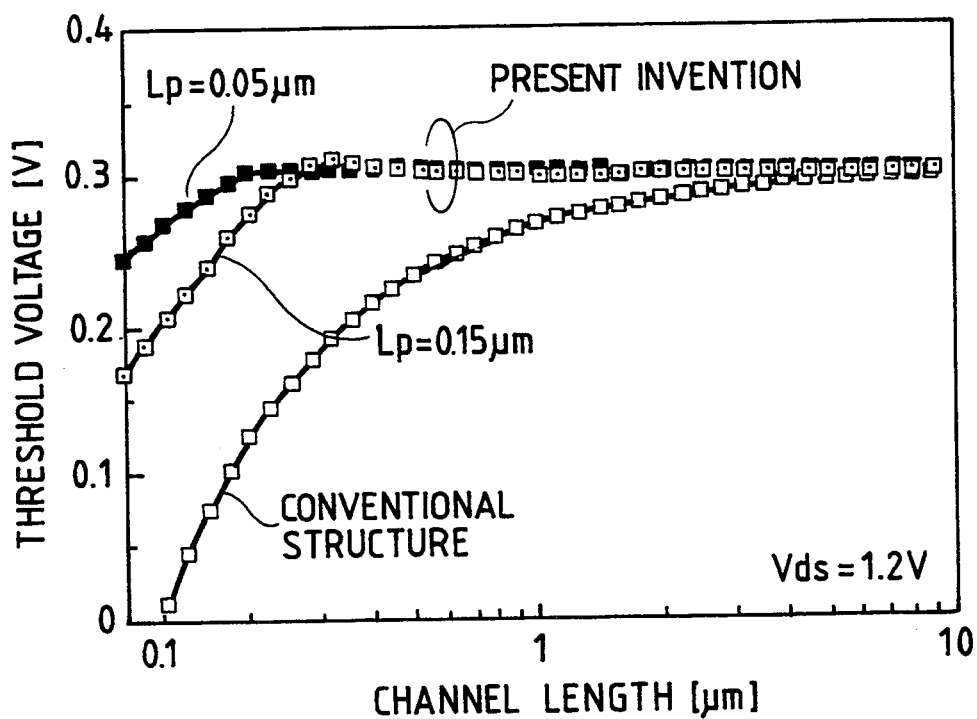
FIG. 10 is a graph showing relation between effective channel length and threshold voltage.
Figure 11:
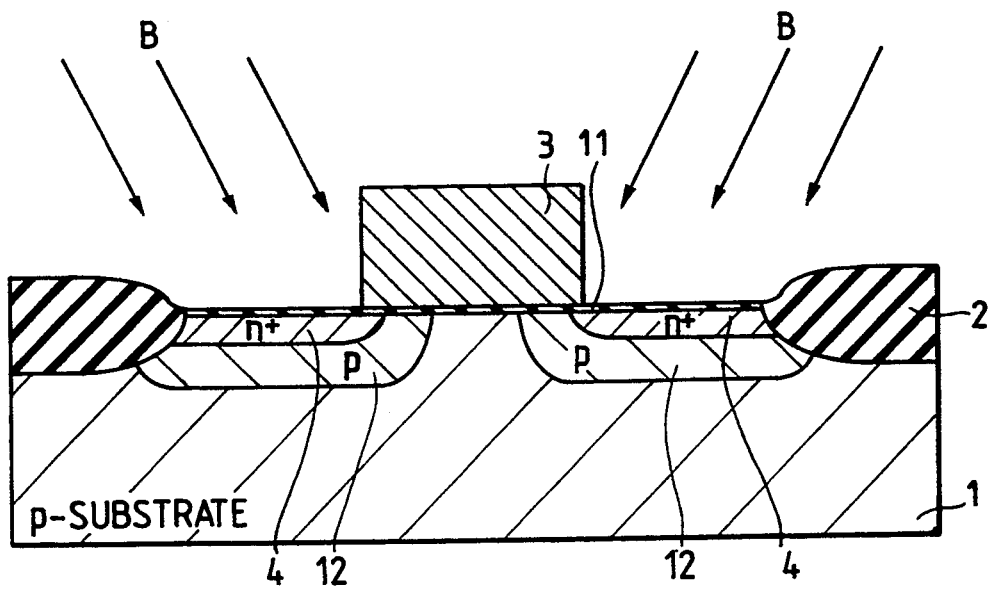
FIG. 11 is a diagram explaining manufacturing method of a semiconductor device shown in the embodiment 1.

Distance of penetration from the channel edge into the channel region (distance from the end of the source, drain 4 to the end of the high concentration region 7) Lp must be determined so that the two high concentration regions 7 do not contact with each other in the design minimum channel length. The channel length dependence of the threshold voltage in the case of Lp being 0.05 μm and 0.15 μm is shown in FIG. 10. When Lp is 0.15 μm, since the two high concentration regions 7 contact with each other at the channel center in the case of the channel length being 0.3 μm or less, the threshold voltage is lowered. Such lowering of the threshold voltage occurs because the structure is the same as that of the prior art 2 when the channel length is 0.3 μm or less, and such characteristics of the present invention cannot be obtained that the threshold voltage rises as the channel length becomes short. However, when Lp is too short, since characteristics of compensating the lowering of the threshold voltage sufficiently cannot be obtained if the concentration in the high concentration region 7 is not raised, in the actual state, the design must be changed depending on what degree of concentration difference is obtained between the surface 5 and the high concentration region 7.

EXAMPLE 2

Figure 2:
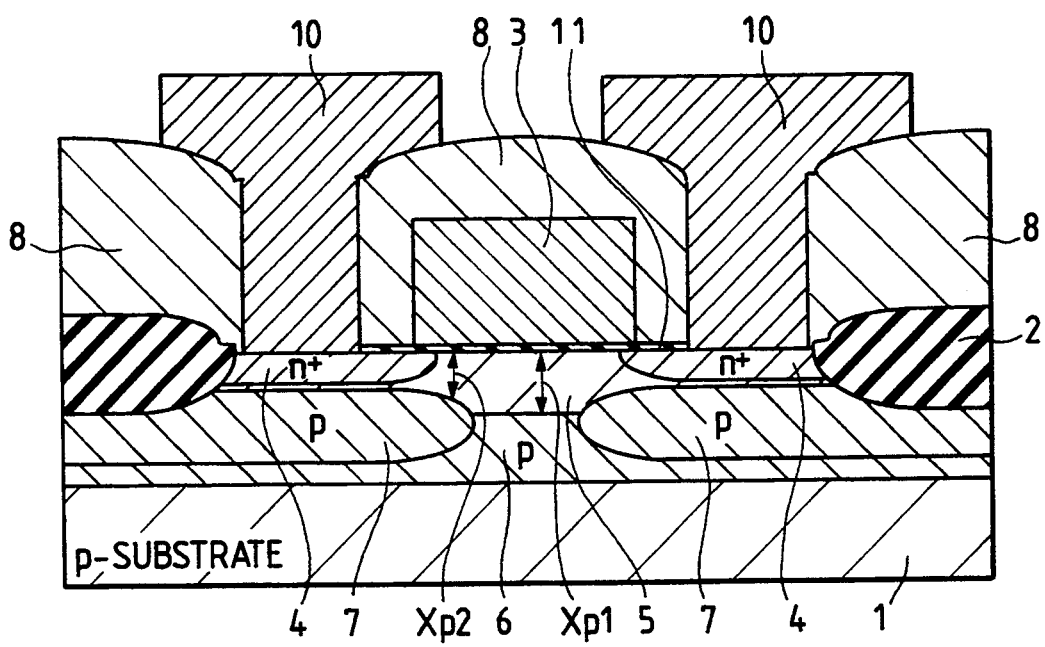
FIG. 2 is a sectional view showing the embodiment 2 of the invention.

Among the high concentration regions 7 formed within the substrate, depth of the region in the definite distance Lp from the channel edge to the channel region is made shallower than depth at the channel center, thereby equivalent effect to that of the embodiment 1 can be obtained. Sectional structure of this embodiment is shown in FIG. 2. Basic structure and manufacturing process are substantially the same as those of the embodiment 1, but energy of ion implantation carried out to form the high concentration region 7 is lowered to 80 keV and the depth $X_{p2}$ is made shallower than the depth $X_{p1}$ of the high concentration region 6. The doping concentration is made $1\times10^{18}/cm^3$ being the same as that of the channel center. The depth $X_{p2}$ of the high concentration region 7 is made shallow, thereby in this region, among the depletion layer spreading from the semiconductor surface when the inversion layer is formed, the volume including the high concentration region 7 is increased. Thereby on both ends of the channel, the average substrate dopant concentration rises and the threshold voltage rises. Therefore by the same principle as that of the embodiment 1, effects of reducing fluctuation of the threshold voltage, raising the mobility and suppressing the punch through can be obtained.

EXAMPLE 3

Figure 3A:
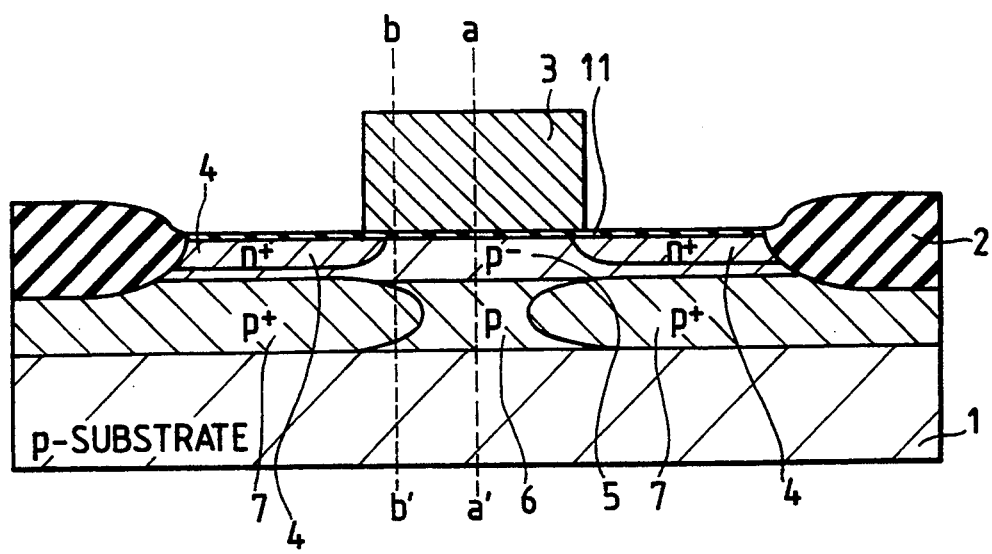
FIGS. 3a and 3b are a sectional view showing the embodiment 3 of the invention and a graph showing doping concentration profile within a semiconductor substrate.
Figure 3B:
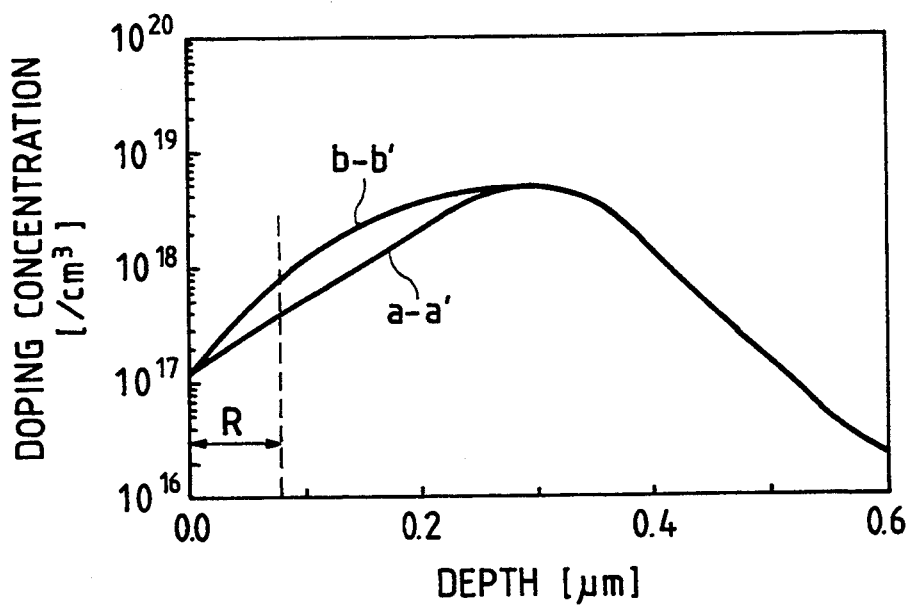
Figure 4:
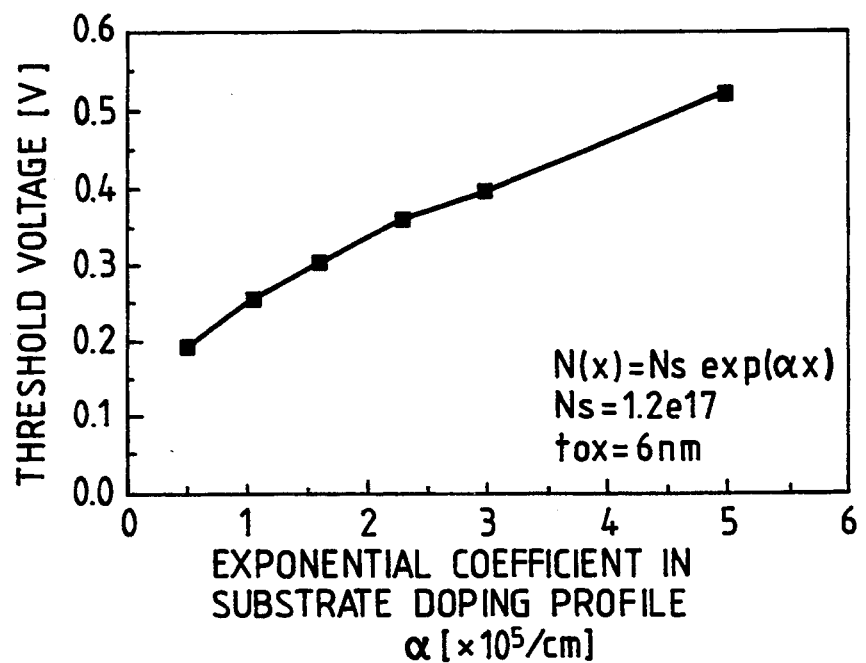
FIG. 4 is a graph showing relation between gradient α of doping concentration profile and threshold voltage in FIG. 3b.
Figure 5:
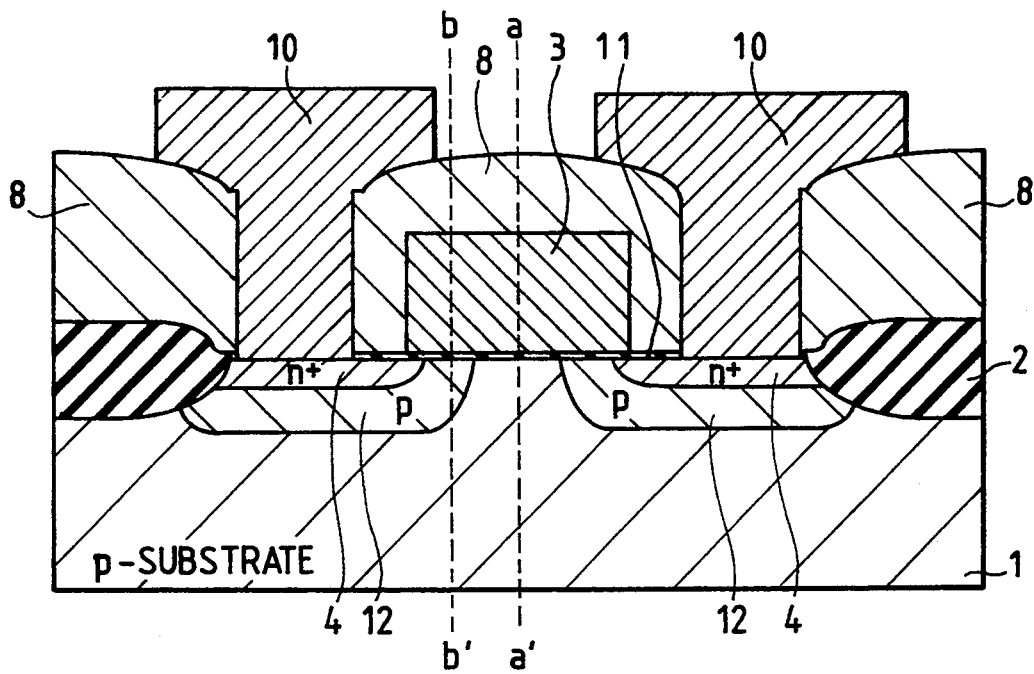
FIG. 5 is a sectional view explaining the prior art 1.
Figure 6:
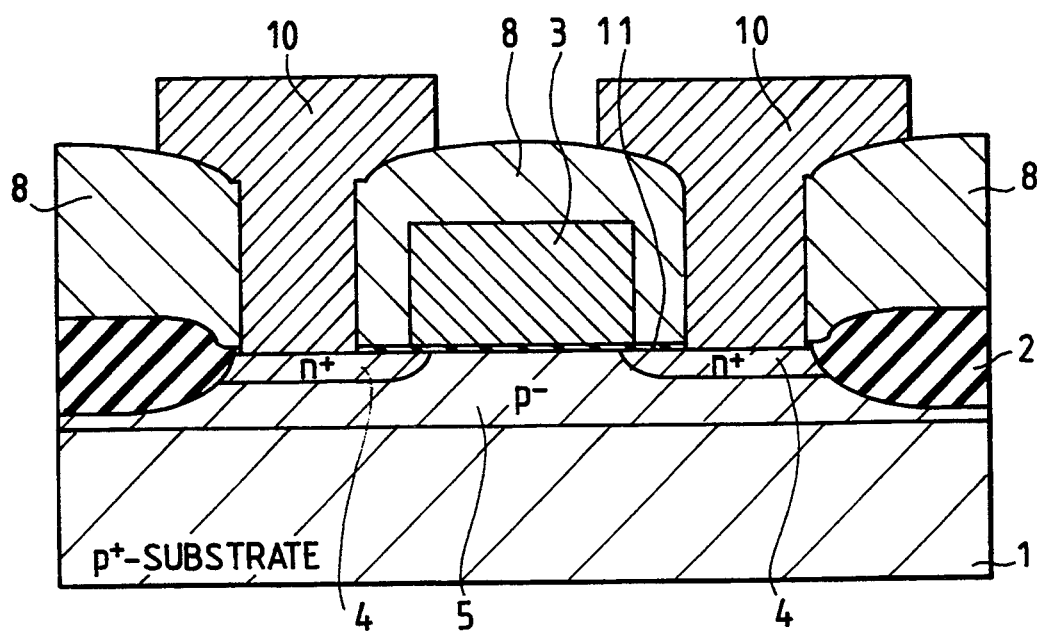
FIG. 6 is a sectional view explaining the prior art 2.
Figure 7:
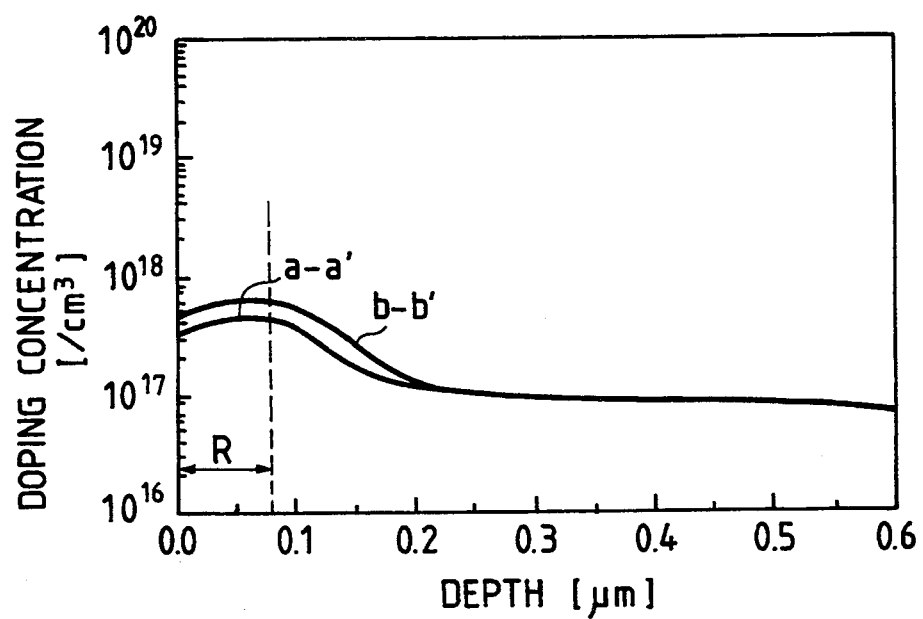
FIG. 7 is a graph showing doping concentration profile in the prior art 1.

Sectional structure of the embodiment 3 having the graded substrate doping profile is shown in FIG. 3a. The doping concentration profile at the channel center a—a' and the channel edge b—b' as shown in FIG. 3b becomes the graded concentration profile in approximately exponential function by the ion implantation. The surface doping concentration at the channel edge b—b' is the same as that at the channel center a—a', but the gradient at the channel edge is larger than that at the channel center. Due to the difference of the gradient, the threshold voltage becomes higher on both ends of the channel. Since the difference of the gradient affects the threshold voltage in the region R where the potential of the band is varied during forming the MIS inversion layer, the difference of the gradient is held at least within the region R. When the surface concentration is $10^{17}/cm^3$ and thickness of the gate oxide film 11 is 6 nm, variation of the threshold voltage by the exponential coefficient (gradient) α is shown in FIG. 4. In this embodiment, at the channel center, the gradient α is $2.1\times10^5/cm$ and the threshold voltage is 0.3 V, and at the channel edge, the gradient is $2.7\times10^5/cm$ and the threshold voltage is 0.35 V. Therefore by the same principle as that of the embodiment 1, ideal characteristics can be obtained in that the threshold voltage is not lowered even if the channel length becomes short. Since the substrate surface of the whole channel region including both ends of the channel can be made low concentration, also the carrier mobility can be increased.

EXAMPLE 4

Figure 12A:
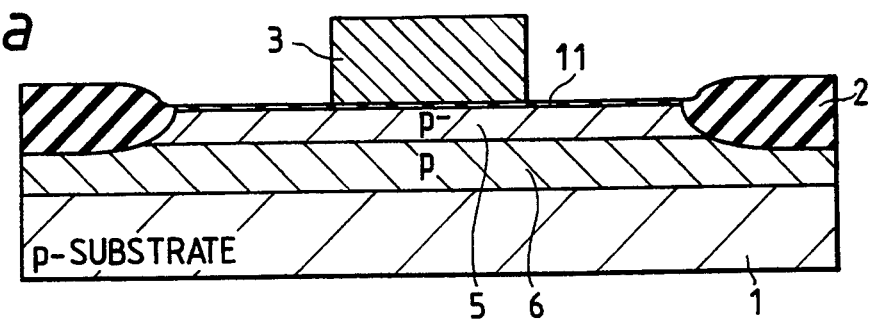
FIGS. 12a–12d are process diagrams showing the embodiment 4 of the invention.

Next, manufacturing method of a semiconductor device of the present invention will be described using FIGS. 12a–12d. First as shown in FIG. 12a, according to manufacturing method of a usual MIS transistor, after forming an isolation region 2, deep ion implantation of boron is carried out (implantation energy 80 keV) to form a high concentration region 6 and exponential graded concentration profile is formed. And then a gate oxide film 11 is formed, and further a polysilicon film is deposited to the whole surface, and then an unnecessary part is removed and a gate electrode 3 is formed.

Figure 12B:
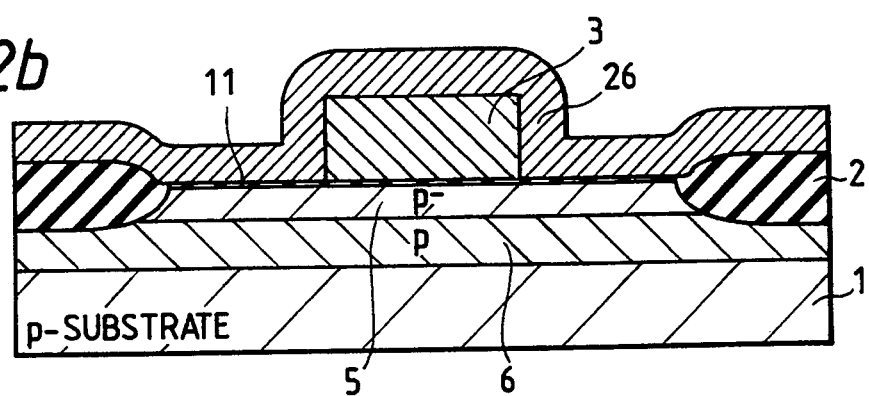

Next as shown in FIG. 12b, tungsten 26 is to the whole surface so that the gate electrode 3 is coated completely, and then the tungsten film 26 is etched entirely by known directional dry etching, and only the tungsten side wall 26 formed on the side surface of the gate electrode 3 is left and the tungsten film 26 formed on other part is removed.

Figure 12C:
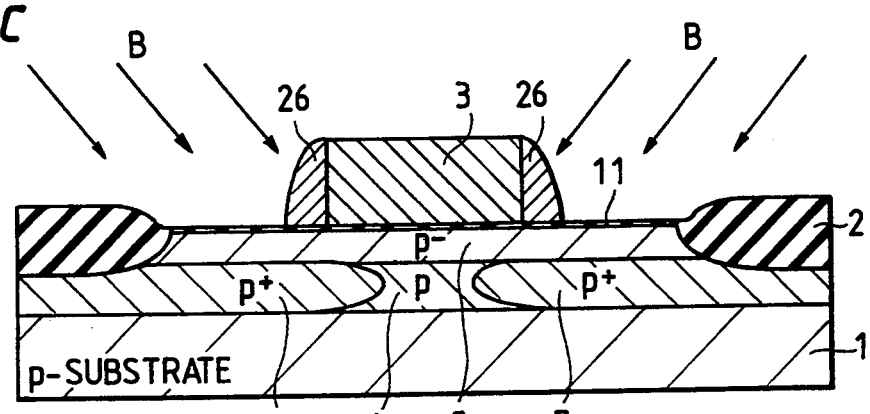

Next as shown in FIG. 12c, oblique ion implantation of boron is carried out (implantation energy 80 keV) in gradient of 40 degrees with respect to the lateral direction of the gate and a p-type high concentration buried layer 7 is formed. Since the projection concentration of tungsten to the boron ion is ½ or less in comparison with silicon, the ion implantation to the side surface of the gate electrode 3 made of polysilicon can be protected so that ions are not implanted to the substrate surface of the channel region. Inside the substrate, the graded doping profile having large gradient can be formed in overlapping with the high concentration region 6. In the case of forming the high concentration region 7 only on one side of the channel, one side of the gate electrode 3 may be coated by the resist when the oblique ion implantation is carried out.

Figure 12D:
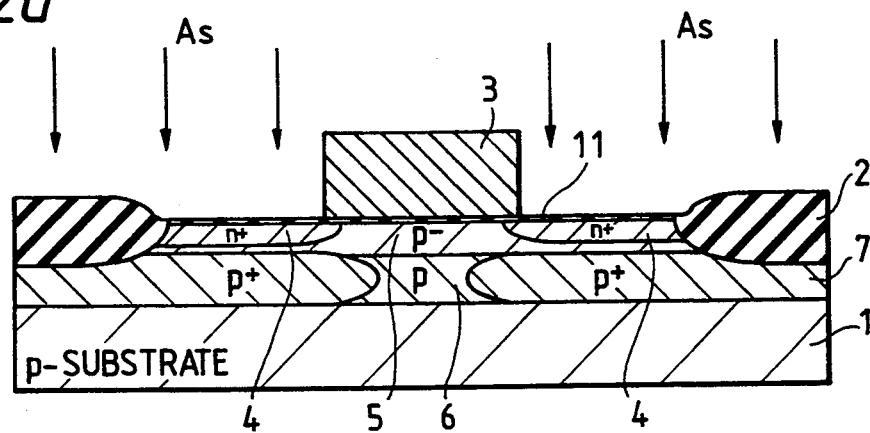

Next as shown in FIG. 12d, after removing the tungsten side wall 26 by wet etching, ion implantation of arsenic is carried out and source, drain region 4 is formed. And then wiring is formed by manufacturing process of a usual MIS transistor and a MIS transistor is completed. According to this embodiment, since the oblique ion implantation is used, the high concentration region 7 can be formed only in the inside of the substrate, not raising the doping concentration of the substrate surface at the channel edge. In this embodiment, although tungsten is used in the side wall, the gate electrode 3 itself may be made of metal such as tungsten.

EXAMPLE 5

Figure 13A:
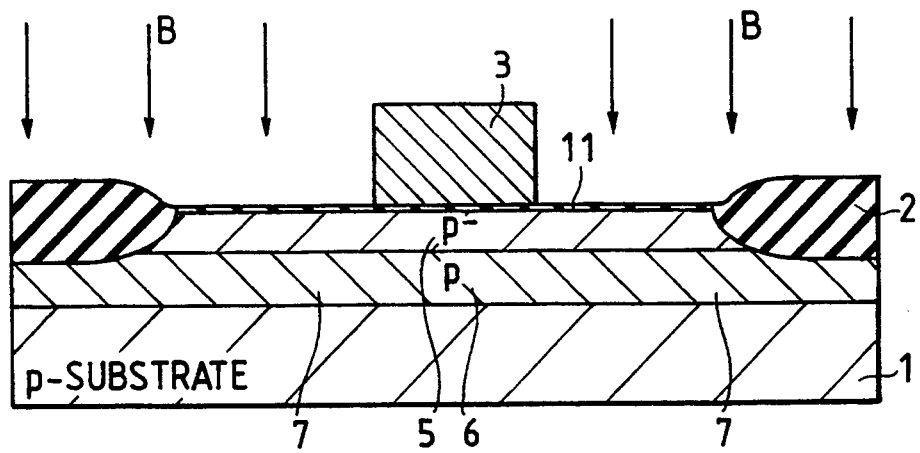
FIGS. 13a–13c are process diagrams showing the embodiment 5 of the invention.

Next, another example of manufacturing method of a semiconductor device of the present invention will be described using FIGS. 13a–13c. In similar manner to the embodiment 4, a gate electrode 3 made of polysilicon is formed. In this case, however, the gate length has value of necessary gate length subtracted by length of the high threshold voltage region on both ends of the channel. Next as shown in FIG. 13a, vertical ion implantation of boron is carried out and a high concentration buried layer 7 is formed.

Figure 13B:
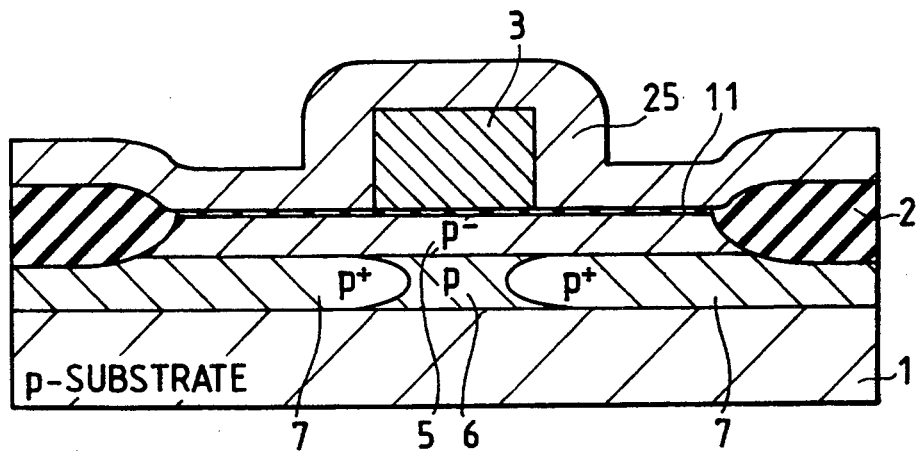

Next as shown in FIG. 13b, polysilicon 25 is deposited to the whole surface so that the gate electrode 3 is coated completely, and then the polysilicon film 25 is etched to the whole surface by known dry etching, and the side wall 25 formed on the side surface of the gate electrode 3 is left and the tungsten film 26 formed on other part is removed. According to this process, the gate length becomes length including thickness of the side wall 25, and a part of the high concentration buried layer 7 is overlapped with the gate electrode 3 and the threshold voltage on both ends of the channel can be made high.

Figure 13C:
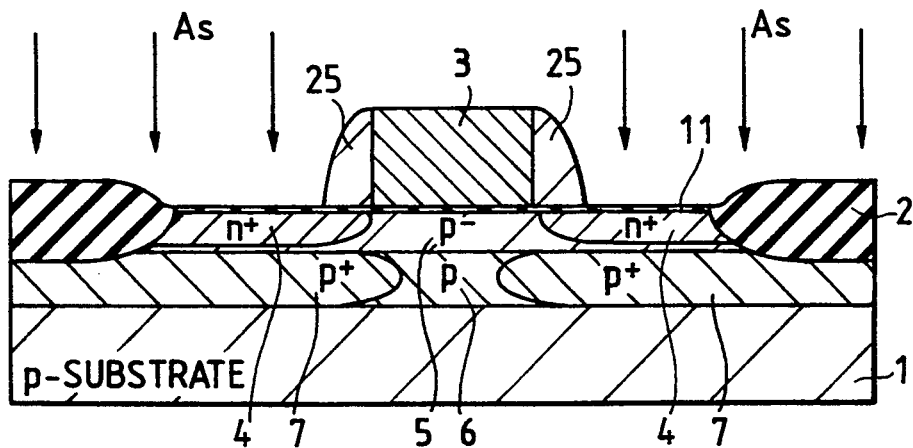

Next as shown in FIG. 13c, ion implantation of arsenic is carried out and source, drain region 4 is formed, and then wiring is formed according to manufacturing process of a usual MIS transistor and a MIS transistor is completed. According to this embodiment, even if the vertical ion implantation is carried out, since the high concentration region 7 can be formed only in the inside of the substrate on both ends of the channel, without the lateral thermal diffusion for a long time, the structure of the present invention can be formed while junction of the source, drain is held shallow.

EXAMPLE 6

Figure 14A:
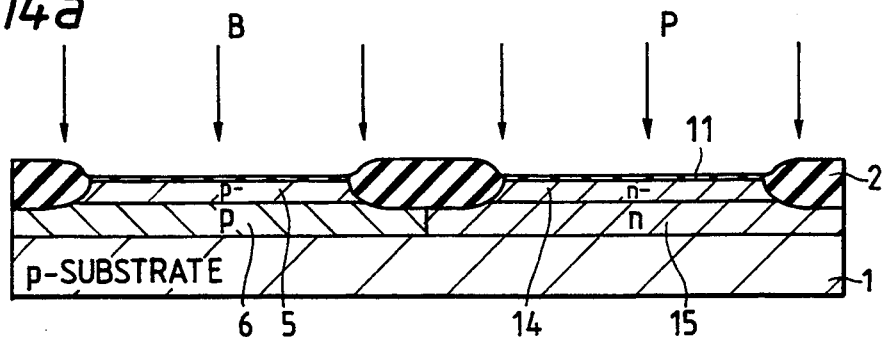
FIGS. 14a–14d are process diagrams showing the embodiment 6 of the invention.

Next, process of manufacturing a CMOS according to the present invention is shown in FIGS. 14a–14d. First, as shown in FIG. 14a, an isolation region 2 is formed in similar manner to a usual CMOS process, and at a region of forming a NMOS, ion implantation of boron is carried out in the acceleration 120 keV and a p-type high concentration region 6 is formed, and at a region of forming a PMOS, ion implantation of phosphorus is carried out in 180 keV and an n-type high concentration region 15 is formed. Then since the high concentration layer is formed on the whole surface of the semiconductor substrate including a part under the isolation oxide film 2, a well and a channel stopper to separate the NMOS and the PMOS may be omitted when the ion implantation is carried out at low voltage. When the ion implantation is carried out at high voltage, before forming the isolation region 2, the ion implantation for well forming is carried out, and the isolation region is formed by the oxidation of the substrate, and at the same time the implanted ions are subjected to thermal diffusion to the inside of the substrate and the well is formed. Also the mask must be designed so that the regions 6, 15 of high concentration do not contact directly. Next, in order to adjust the doping concentration on the surface of the semiconductor substrate, boron fluoride is implanted to the NMOS forming region at 50 keV and phosphorus is ion-implanted to the PMOS forming region at 30 keV.

Figure 14B:
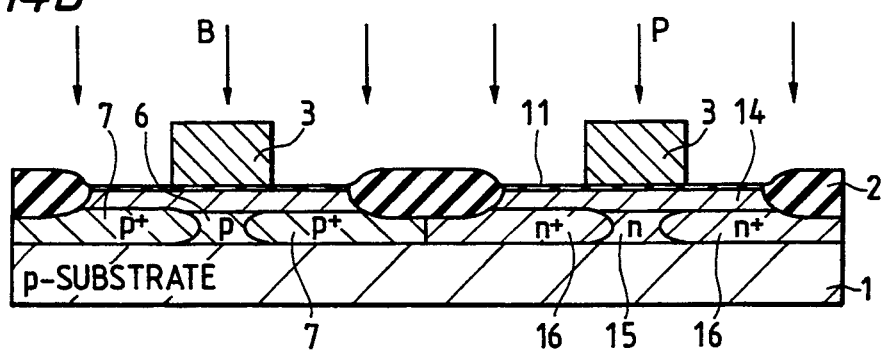
Figure 14C:
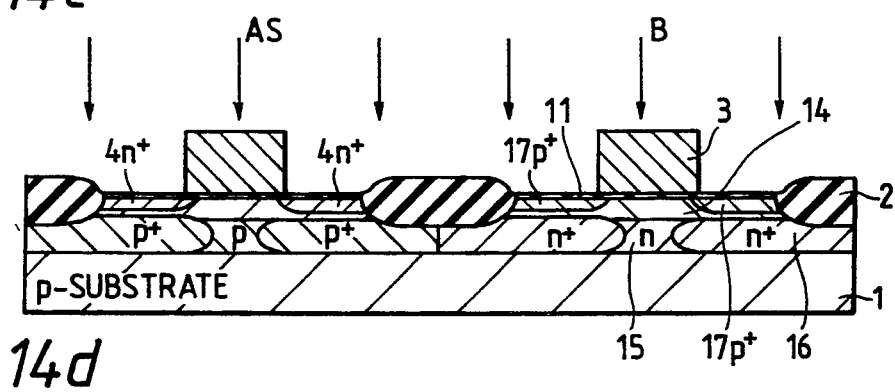

As shown in FIG. 14b, polysilicon to form a gate electrode is deposited and an unnecessary part is removed by dry etching and a gate electrode 3 is formed, and then ion implantation is carried out and a p-type high concentration region 7 is formed. Ion implantation condition in this case, in both NMOS and PMOS, is the same as the condition to form the high concentration regions 6, 15. If the ion implantation is carried out using the oblique ion implantation, the concentration profile and the penetrating distance Lp can be controlled with high accuracy. Thickness of a gate electrode must be noticed during the ion implantation. If there is a fear that ions be implanted penetrating the gate electrode 3, it is necessary that an oxide film or the like is deposited on polysilicon and the thickness is increased and then etching is carried out and the gate electrode 3 is formed and the ion implantation is carried out. Also the ion implantation may be carried out in the state that the resist to be used in forming the gate electrode 3 is provided. Process steps after this state is the same as the usual CMOS manufacturing process, and as shown in FIG. 14c, the source, drain is formed by the ion implantation and anneal is carried out at 850° C. for 10 minutes, and the impurity is activated and the lattice defect is removed and the penetration depth of the high concentration regions 7, 16 into the channel region is adjusted.

Figure 14D:
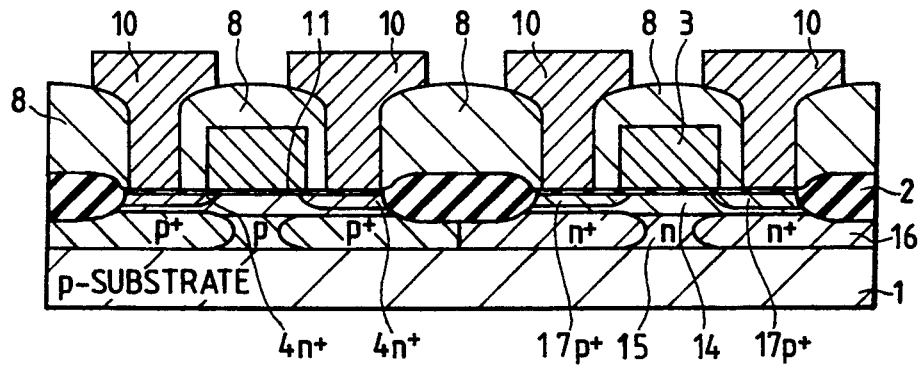

Next as shown in FIG. 14d, an interlayer insulation film 8 is deposited and a hole for contact is formed, and then an aluminium film 10 is deposited and patterning is carried out thereby the CMOS structure is completed.

EXAMPLE 7

Figure 15:
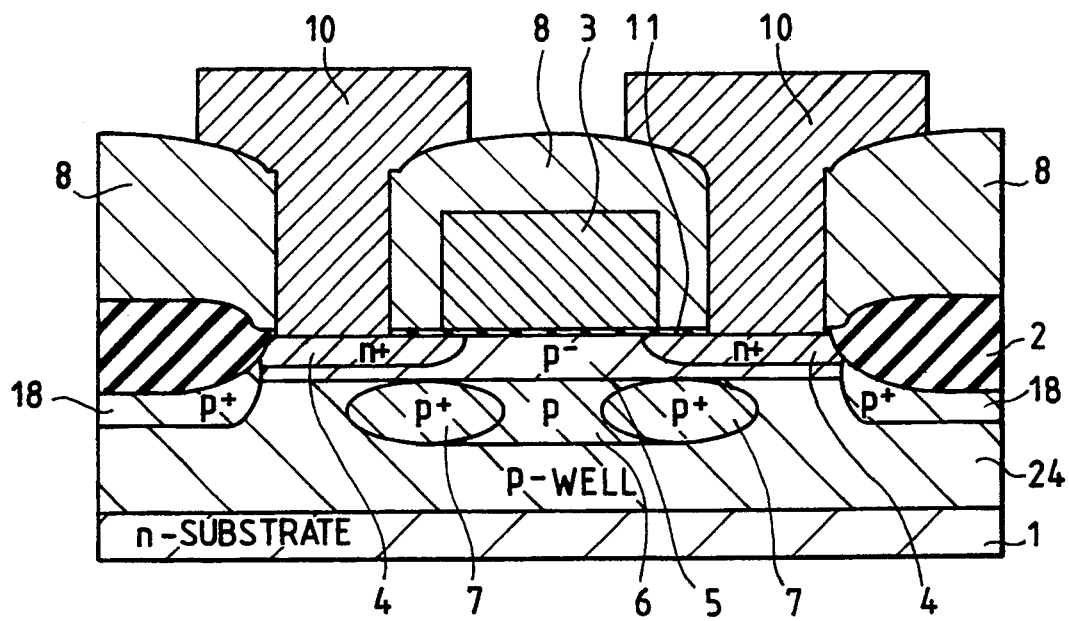
FIG. 15 is a sectional view showing the embodiment 7 of the invention.

In each of the embodiments as above described, since the high concentration layers 6, 7 are entirely overlapped with the source, drain 4, there is a problem that the junction capacitance is increased and the operation speed is decreased. This embodiment solves this problem, and will be described using FIG. 15. The manufacturing process is substantially the same as that of the embodiment 1, but when the high concentration layers 6, 7 are formed by the ion implantation, a mask by photo resist is used and the ion implantation is carried out only to the channel region. Therefore since most of the source, drain region 4 does not contact with the high concentration regions 6, 7, the junction capacitance is reduced and the operation speed can be improved. Also if the focused ion implantation (FIB) is used, the ion beam is focused thereby the high concentration buried layer can be formed only within the channel region. In the case of the CMOS structure using such structure, the well 24 and the channel stopper 18 must be always provided.

EXAMPLE 8

Figure 16:
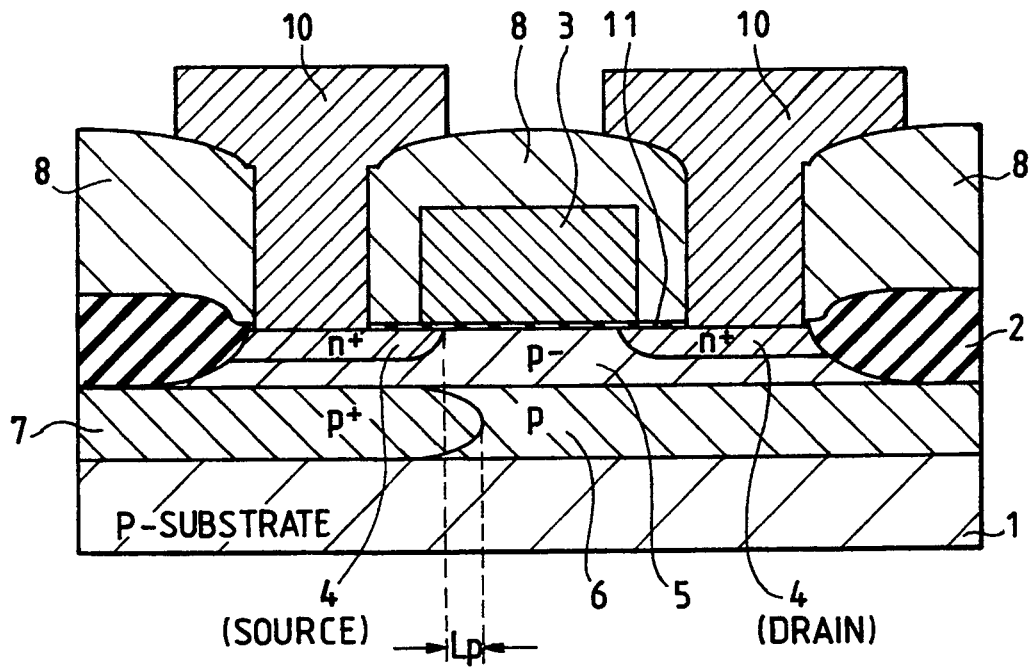
FIG. 16 is a sectional view showing the embodiment 8 of the invention.

An embodiment providing a high concentration buried layer 7 only at one side of the channel edge is shown in FIG. 16. In this embodiment, the high concentration buried layer of the channel edge is formed only at the source side. In this embodiment in similar manner to the embodiment 1, the high concentration buried layer 7 is formed only at the source side where there is no influence of the depletion layer produced by the drain voltage and the control effect of the threshold voltage is high. Effect of suppressing variation of the threshold voltage due to variation of the gate length is substantially the same as that of the embodiment 1, and at the drain side, since no contact exists between the high concentration layer 7 and the drain, there is effect in the reduction of the drain capacitance and improvement in the drain break down voltage.

EXAMPLE 9

Figure 17:
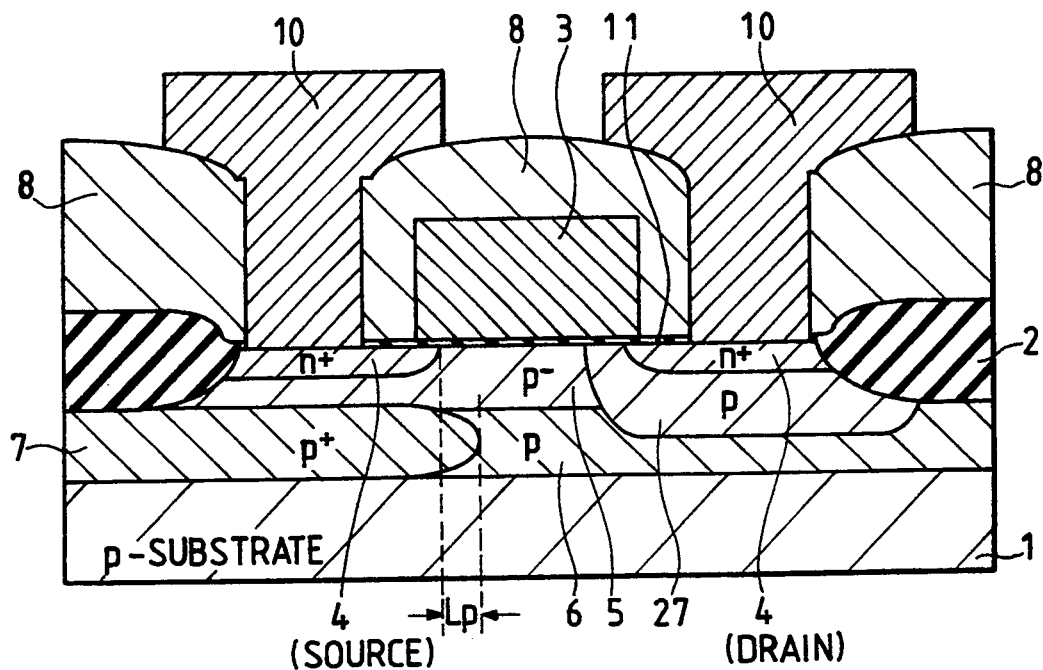
FIG. 17 is a sectional view showing the embodiment 9 of the invention.

This embodiment relates to a MOS transistor having high output resistance. In an analog amplifier, since gain is determined by product of output resistance and mutual conductance, high output resistance is necessary. As shown in FIG. 17, structure of the source side of this embodiment is the same as that of the embodiment 1, but at the drain side, a high concentration layer 27 extends to the channel edge of the surface low concentration layer 5. This structure is effective to reduce the phenomenon of channel length modulation that in the saturation region of current characteristics, the surface is made to be a depletion layer by the drain voltage and the effective channel length becomes short. Thereby variation of the drain current due to the drain voltage in the saturation region is reduced and the output resistance can be made high.

EXAMPLE 10

Figure 18:
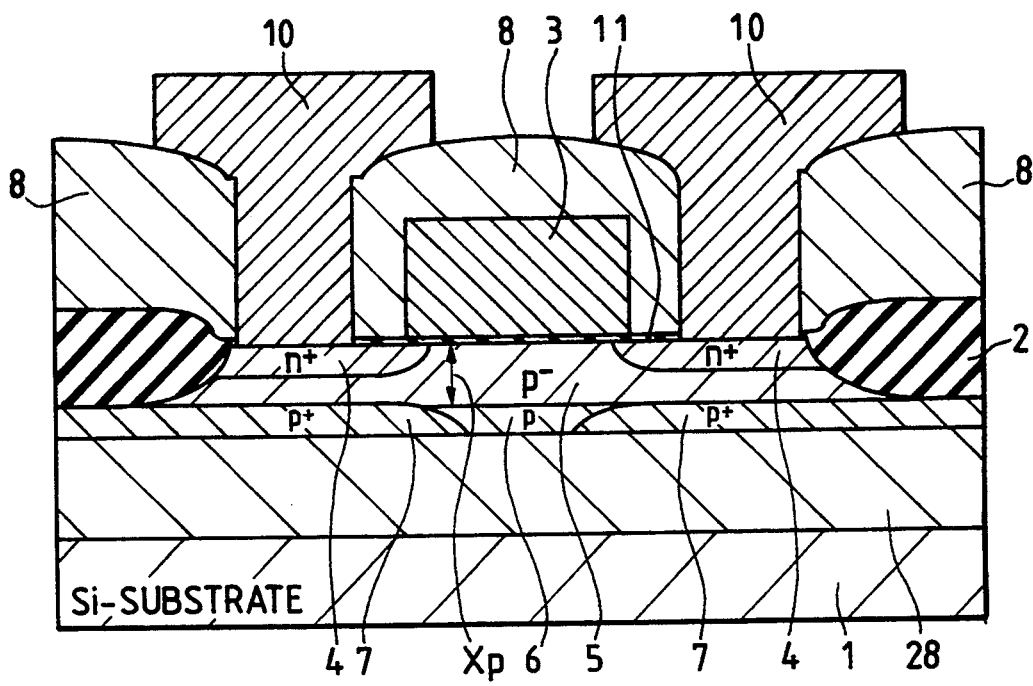
FIG. 18 is a sectional view showing the embodiment 10 of the invention.

An embodiment of realizing the present invention in SOI structure (Silicon On Insulator) is shown in FIG. 18. An oxidized silicon film 28 is provided under the high doping concentration layers 6, 7, and the punch through is suppressed. In the case of the SOI structure, since the punch through is suppressed by the oxide film 28, a buried layer 6 is unnecessary. According to this embodiment, even if the channel length becomes short further in comparison with the structure shown in FIG. 1, the threshold voltage can be held constant.

EXAMPLE 11

Figure 19:
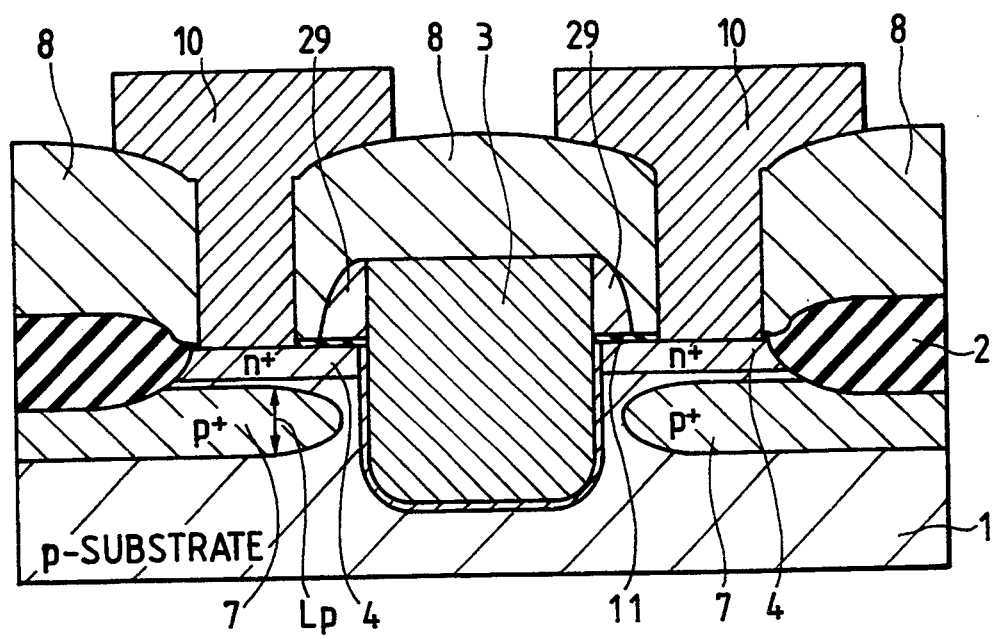
FIG. 19 is a sectional view showing the embodiment 11 of the invention.

The present invention can be used also at a buried gate transistor having structure of a gate electrode being buried to the inside of a semiconductor substrate or at a vertical MOS transistor. FIG. 19 shows an embodiment where the present invention is applied to a buried gate MIS transistor. In this structure, since a channel exists also in the vertical direction at the channel edge, the thickness of the high concentration layer 7 becomes the distance Lp from the channel edge. In order to hold the channel surface to low concentration, the high concentration layer 7 is formed separate by Xp from the gate oxide film. After forming the gate electrode 3, a side wall 29 is formed and then the ion implantation is carried out and the high concentration layer 7 is formed. Xp can be controlled by the thickness of the side wall 29.

EXAMPLE 12

Figure 20:
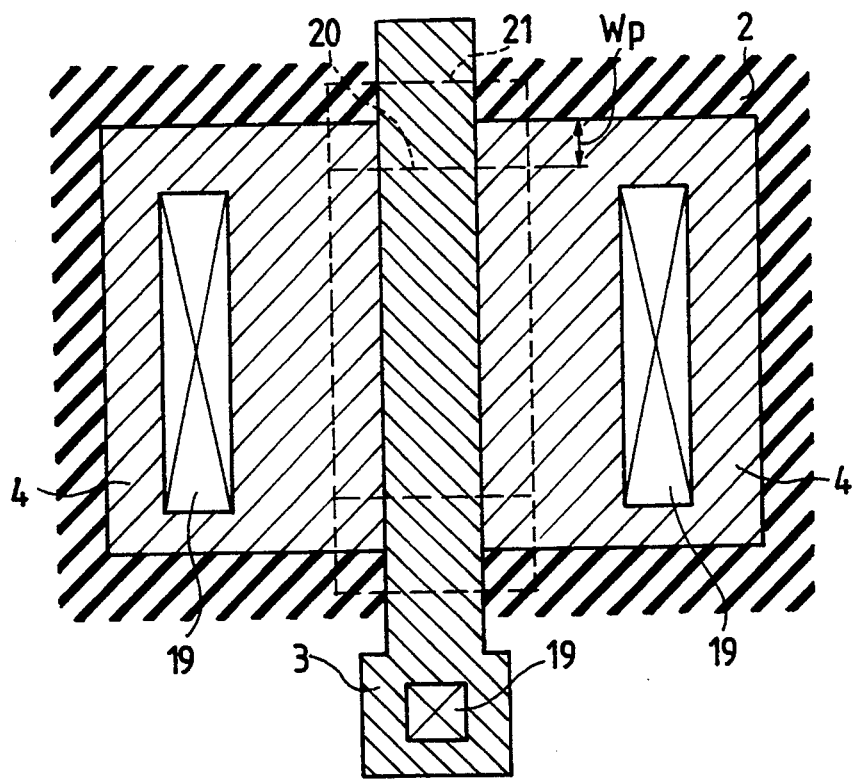
FIGS. 20 and 21 are sectional view and a graph showing the embodiment 12 of the invention respectively.
Figure 21:
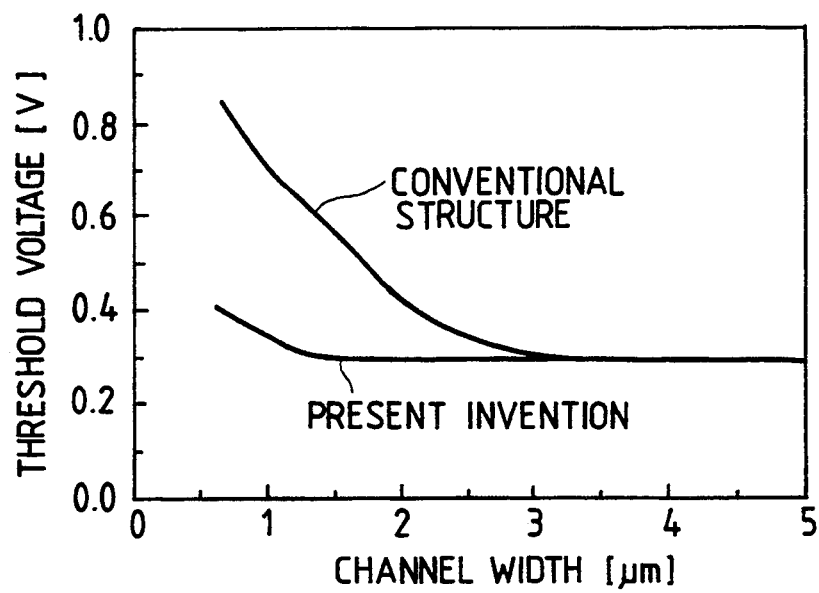

A plan view of an embodiment reducing the narrow channel effect according to the present invention is shown in FIG. 20. The narrow channel effect is a phenomenon that the threshold voltage rises by influence of the high concentration channel stopper 18 (refer to FIG. 15) under the isolation region 2 when the channel width becomes narrow. The basic structure of this embodiment is the same as that of the embodiment 7, but an ion implantation mask 21 to be used in forming the high concentration mask 6 and an ion implantation mask 20 to be used in forming the high concentration region 7 are provided separately. The high concentration region 6 is necessary in the whole channel region so as to suppress the punch through. Since the high concentration region 7 is that for forming a region having the high threshold voltage, it need not be provided in definite distance Wp from the isolation region where the channel stopper 18 is diffused and the threshold voltage seems to be high. Since reduction of dimension in the gate width direction is carried out in proportion to the gate length, in the fine level to produce the narrow channel effect, the short channel effect occurs significantly in the region naturally, and ratio of the high concentration region 7 occupying in the channel region is large and the large difference is produced in the threshold voltage depending on whether the high concentration region 7 exists or not. Consequently, the high concentration region 7 is not provided at a part where the threshold voltage is increased by influence of the channel stopper 12, thereby the threshold voltage in this part can be made the same threshold voltage as that of the gate width center part. Effect of this embodiment in the channel width dependence of the threshold voltage is shown in FIG. 21. In the conventional structure, rise of the threshold voltage is seen from about 3 μm of the channel width, but in this embodiment, variation of the threshold voltage can be suppressed substantially.

EXAMPLE 13

Figure 22:
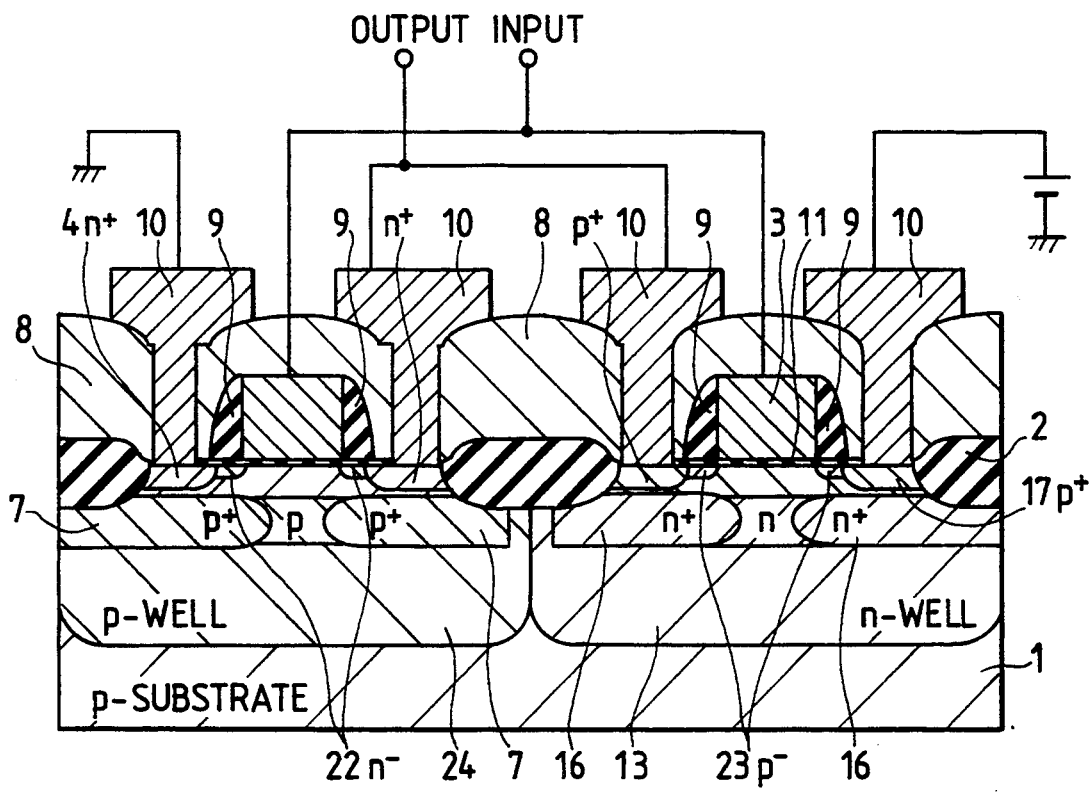
FIGS. 22, 23 and 24 are a sectional view, a block diagram of a low voltage operation LSI and a circuit diagram of a differential amplifier for a comparator explaining the embodiment 13 of the invention respectively.

The present invention can be used together with LDD structure or the like. An embodiment using the present invention to a CMOS of the LDD structure is shown in FIG. 22. The basic manufacturing process is the same as the process shown in FIGS. 14a–14d, but both n, p wells are provided for high break down voltage. The high concentration region 16 of PMOS and the high concentration region 7 of NMOS are formed separate from each other so that both do not contact. After the high concentration regions 7, 16 are formed by the ion implantation using the gate electrode 3 as a mask, low concentration drain regions 22, 23 are formed by the ion implantation. And then, after forming a side wall 9, source, drain regions 4 and 17 are formed by the ion implantation. Process since then is quite the same as that shown in FIG. 14. According to this embodiment, a MOS transistor can be obtained where no lowering of the threshold voltage exists in the case of the short channel length and the mobility is large, and further the break down voltage is high by the LDD structure and the hot carrier is not liable to affect it.

EXAMPLE 14

Figure 23:
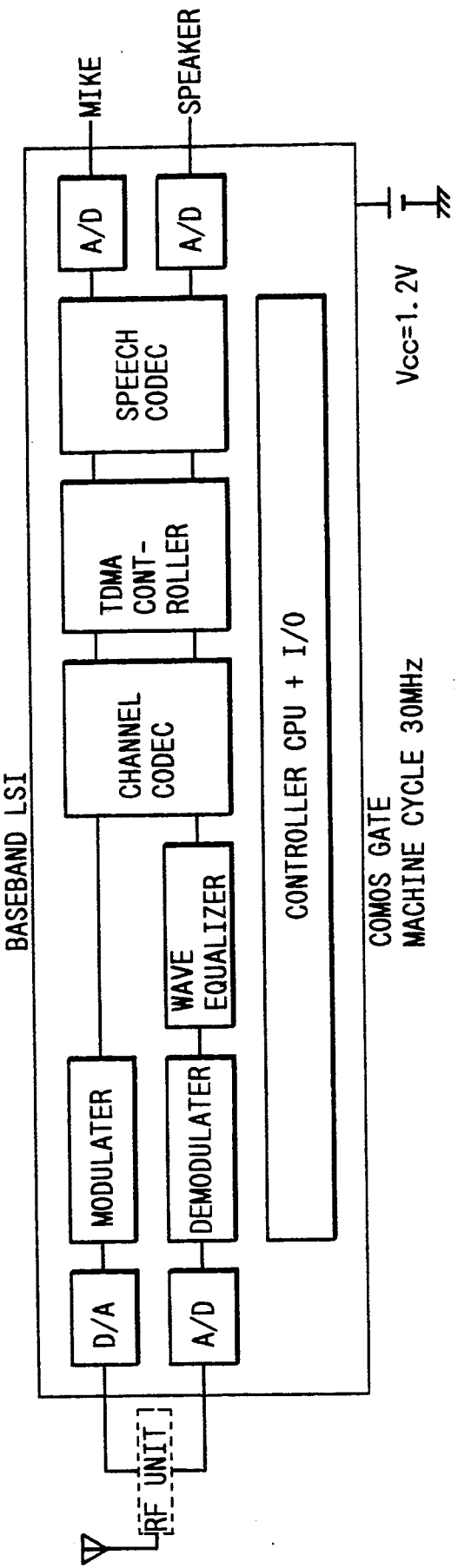

A MOS transistor of the present invention is effective for a mixed analog/digital LSI in low voltage and low power operation to be used for portable equipment or the like. In the portable equipment, low voltage operation is carried out and the consumption power of the LSI is decreased so as to suppress the battery consumption. In the low voltage operation, drive current of the MOS transistor is varied significantly depending on the threshold voltage. However, since the transistor of the present invention is not affected by fluctuation the gate dimension but the definite threshold voltage can be obtained, a circuit with little fluctuation of characteristics can be obtained. FIG. 23 shows a block diagram of a mixed analog/digital base band LSI to be used for a portable digital celler terminal. This embodiment is constituted by A/D and D/A converters and a DSP (Digital Signal Processor), and is operated at 1.2 V by a battery. A MOS gate section of the LSI shown in FIG. 23 can be formed by the manufacturing process shown in FIGS. 14$a$–14$d$, or the structure shown in FIG. 22 can be used. In such cases, since the A/D converter or the D/A converter is not affected by fluctuation of dimension of the gate electrode, conversion with high accuracy becomes possible, and the gate delay time fluctuation can be reduced in the digital circuit part.

Figure 24:
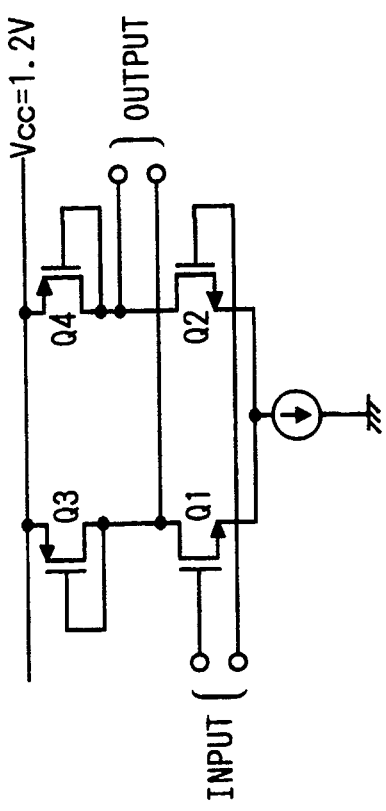

On the other hand, in the A/D converter, the most important part to determine accuracy of conversion is an input differential amplifier. If there is difference in the threshold voltage between two differential amplifiers in input, it appears as offset voltage in output and its fluctuation becomes fluctuation in digital output. A circuit of a differential amplifier using transistors of the present invention is shown in FIG. 24. According to the present invention, fluctuation of offset voltage in output is decreased, and an A/D converter with high accuracy becomes possible even at low voltage.

As described above, according to the present invention, lowering of the threshold voltage at the short channel is prevented, and fluctuation of the threshold voltage due to fluctuation of dimension of the gate electrode is suppressed, and further a MIS semiconductor device with low semiconductor surface concentration and high carrier mobility can be realized. Thereby a semiconductor integrated circuit is realized where there is little fluctuation of characteristics even at low voltage and high speed operation is possible.

In the present invention, the Xp may be in range of 0.01 $\mu$m–0.2 $\mu$m, and Xp$_2$ may be shallower than Xp. Lp is preferably in 0.01 $\mu$m–0.2 $\mu$m to obtain advantageous effects, and also it is preferable that the doping concentration of the p-type layer 5 be $1\times10^{15}$–$10^{18}$/cm$^3$, thickness and the doping concentration of the high concentration region 6 be 0.01 $\mu$m–0.6 $\mu$m and $1\times10^{17}$–$1\times10^{19}$/cm$^3$ respectively, and thickness and the doping concentration of the high concentration region 7 be 0.01 $\mu$m–0.6 $\mu$m and $1\times10^{17}$–$1\times10^{19}$/cm$^3$ respectively. In this constitution, in the MIS transistor with the channel length (distance between source and drain) being 0.03 $\mu$m–3 $\mu$m, the short channel effect can be suppressed effectively and the quite high carrier mobility has been confirmed.

What is claimed is:

1. A semiconductor device comprising:
   a first region formed within a surface region of a semiconductor substrate having a first conductivity type, said first region having a low doping concentration and the first conductivity type;
   a source region and drain region arranged through prescribed spacing with a surface region of said first region, and having a second conductivity type opposite to the first conductivity type;
   a gate electrode formed on a surface of said first region between said source region and said drain region through an insulation film;
   a second region formed within said semiconductor substrate contacting with a lower surface of said first region, said second region having a doping concentration higher than that of said first region and having the first conductivity type; and
   a third region formed within said second region below said source region, said third region having a doping concentration higher than that of said second region and having the first conductivity type, wherein the third region extends in a lateral direction beyond an inner edge of the source region toward the drain region.

2. A semiconductor device as set forth in claim 1, further comprising a fourth region formed within said second region below said drain region, said fourth region having a doping concentration higher than that of said second region and having the first conductivity type, wherein the fourth region extends in a lateral direction beyond an inner edge of the drain region toward the source region, and wherein the third and fourth regions are separated from one another by a predetermined space with a portion of said second region interposed between said third and fourth regions.

3. A semiconductor device according to claim 2, wherein said third region does not extend completely under said source region and said fourth region does not extend completely under said drain region.

4. A semiconductor device as set forth in claim 2, wherein said second region and said third region are formed on an insulation film.

5. A semiconductor device as set forth in claim 2, wherein a depth of a lower surface of said third region is nearly equal to a depth of a lower surface of said second region.

6. A semiconductor device as set forth in claim 2, wherein a depth of a lower surface of said third region is shallower than a depth of a lower surface of said second region.

7. A semiconductor device as set forth in claim 6, wherein a depth of an upper surface of said third region is shallower than a depth of the first region.

8. A semiconductor device as set forth in claim 2, wherein a side wall material is formed on a side wall of the gate electrode.

9. A semiconductor device as set forth in claim 8, wherein said third region is an ion implanted region formed by oblique ion implantation using said side wall material as a mask.

10. A semiconductor device as set forth in claim 2, wherein a low concentration region having the first conductivity type is formed contacting with the inner edges of said source region and said drain region, respectively.

11. A semiconductor device as set forth in claim 2, wherein a depth of a lower surface of said first region is 0.01 μm–0.2 μm.

12. A semiconductor device as set forth in claim 2, wherein a doping concentration of said first region is $1 \times 10^{15}$–$1 \times 10^{18}$/cm$^3$.

13. A semiconductor device as set forth in claim 2, wherein thickness of said second region is 0.01–0.6 μm.

14. A semiconductor device as set forth in claim 2, wherein a doping concentration of said second region is $1 \times 10^{17}$–$1 \times 10^{19}$/cm$^3$.

15. A semiconductor device as set forth in claim 2, wherein a thickness of said third region is 0.01 μm–0.6 μm.

16. A semiconductor device as set forth in claim 2, wherein a doping concentration of said third region is $1 \times 10^{17}$–$1 \times 10^{19}$/cm$^3$.

17. A semiconductor device as set forth in claim 2, wherein a distance between ends opposed to each other of said third region is less than ½ of a distance between said source region and drain region.

18. A semiconductor device as set forth in claim 19, wherein the distance by which said third region extends beyond the inner edge of said source region is 0.01 μm–0.2 μm.

19. Semiconductor device according to claim 2, wherein the third region extends a predetermined distance in said lateral direction beyond the inner edge of said source region, wherein the predetermine distance is ½ or less than a distance between the source region and the drain region.

20. A semiconductor device according to claim 19, wherein the fourth region extends a predetermined distance in said lateral direction beyond the inner edge of the drain region, wherein the predetermined distance which the fourth region extends is ½ or less than the distance between the source and drain regions, and wherein a combined distance of the predetermined distance that the third region extends and the predetermined distance that the fourth region extends is less than the distance between the source and drain regions so that the third and fourth regions do not contact one another.

21. A semiconductor device according to claim 8, wherein said side wall material has a projection range of ion implantation which is shorter than the gate electrode.

22. A semiconductor device comprising:
a first region formed within a surface region of a semiconductor substrate having a first conductivity type, said first region having a low doping concentration and having the first conductivity type;
a source region and drain region arranged through prescribed spacing with a surface region of said first region, and having a second conductivity type opposite to the first conductivity type;
a gate electrode formed on a surface of said first region between said source region and said drain region through an insulation film;
a second region formed within said semiconductor substrate contacting with a lower surface of said first region, said second region having a doping concentration higher than that of said first region and having the first conductivity type; and
means for offsetting a decrease in threshold voltage caused by a short channel effect between the source and drain regions of the semiconductor device, said offsetting means comprising a third region formed within said second region below the source region, said third region having a doping concentration higher than that of said second region and having the first conductivity type, wherein the third region extends a predetermined distance in a lateral direction beyond an inner edge of said source region toward said drain region, and said offsetting means further comprising a fourth region formed within said second region under said drain region, said fourth region having a doping concentration higher than that of said second region and having the first conductivity type, wherein the fourth region extends a predetermined amount in a lateral direction beyond an inner edge of said drain region toward said source region, wherein said third region and said fourth region are separated from one another by a predetermined spacing, with said second region interposed between said third and fourth region, and wherein said third and fourth regions increase the threshold voltage of the semiconductor device to offset decreases in the threshold voltage of the semiconductor device caused by the short channel effect.

23. A semiconductor device comprising:
a first region formed within a surface region of a semiconductor substrate having a first conductivity type, said first region having low doping concentration and first conductivity type;
a source region and drain region arranged through prescribed spacing with a surface region of said first region, and having a second conductivity type opposite said first conductivity type;
a gate electrode formed on a surface of said first region between said source region and said drain region through an insulating film;
a second region formed within said semiconductor substrate contacting with a lower surface of said first region, said second region having a doping concentration higher than that of said first region and having the first conductivity type; and
a third region formed within said second region below said source region, said third region having a doping concentration higher than that of said second region and having the first conductivity type, wherein the third region extends in a lateral direction beyond an inner edge of said source region toward the drain region; and
a fourth region formed within said second region under said drain region, said fourth region having doping concentration higher than that of said second region and the first conductivity type, wherein the fourth region extends in a lateral direction beyond an inner edge of said drain region toward the source region, wherein said third region and fourth region are separated from one another by a predetermined space with a portion of said second region interposed between said third and fourth regions,
wherein said third region extends in the lateral direction under a first portion of the source region, and said semiconductor substrate extends under a second portion of the source region, and wherein said fourth region extends under a first portion of the drain region and the semiconductor substrate extends under a second portion of the drain region.

24. A semiconductor device comprising:
a first region formed within a surface region of a semiconductor substrate having a first conductivity type, said first region having low doping concentration and first conductivity type;
a source region and a drain region arranged through prescribed spacing with a surface region of said first region, and having a second conductivity type opposite to the first conductivity type;
a gate electrode formed on a surface of said first region between said source region and said drain region through an insulation film;
a second region formed within said semiconductor substrate contacting with a lower surface of said first region, said second region having a doping concentration higher than that of said first region and having the first conductivity type; and
a third region formed within said second region below said source region, said third region having a doping concentration higher than that of said second region and having the first conductivity type;
wherein a depth of a lower surface of said third region is shallower than a depth of a lower surface of said second region.

25. A semiconductor device comprising:
a first region formed within a surface region of a semiconductor substrate having a first conductivity type, said first region having low doping concentration and having the first conductivity type;
a source region and drain region arranged through prescribed spacing with a surface region of said first region, and having a second conductivity type opposite to the first conductivity type;
a gate electrode formed on a surface of said first region between said source region and said drain region through an insulation film;
a second region formed within said semiconductor substrate contacting with a lower surface of said first region, said second region having a doping concentration higher than that of said first region and having the first conductivity type; and
a third region formed within said second region below said source region, said third region having a doping concentration higher than that of said second region and having the first conductivity type;
wherein a depth of an upper surface of said third region is shallower than depth of the first region.

* * * * *